United States Patent
Kojima et al.

(10) Patent No.: US 8,070,557 B2
(45) Date of Patent: Dec. 6, 2011

(54) METHOD OF POLISHING GLASS SUBSTRATE

(75) Inventors: Hiroshi Kojima, Tokyo (JP); Masabumi Ito, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 12/631,004

(22) Filed: Dec. 4, 2009

(65) Prior Publication Data

US 2010/0075577 A1  Mar. 25, 2010

Related U.S. Application Data

(63) Continuation of application No. PCT/JP2008/060231, filed on Jun. 3, 2008.

(30) Foreign Application Priority Data

Jun. 5, 2007  (JP) .................................. 2007-149705

(51) Int. Cl.
*B24B 1/00* (2006.01)
(52) U.S. Cl. .................... 451/36; 65/61; 430/5; 451/41; 451/56; 451/57; 451/60
(58) Field of Classification Search .......... 65/61; 430/5; 451/36, 41, 56, 57, 59, 60, 63; 716/19, 50
See application file for complete search history.

(56) References Cited

U.S. PATENT DOCUMENTS

| 6,576,380 | B2 | 6/2003 | Davis, Jr. et al. |
| 6,931,097 | B1 | 8/2005 | Davis, Jr. et al. |
| 2004/0035153 | A1* | 2/2004 | Koike et al. ...................... 65/61 |
| 2007/0066066 | A1 | 3/2007 | Kojima et al. |
| 2008/0311487 | A1 | 12/2008 | Ito et al. |

FOREIGN PATENT DOCUMENTS

| JP | 11-335979 | 12/1999 |
| JP | 2003-505891 | 2/2003 |
| JP | 2003-211351 | 7/2003 |
| JP | 2004-098278 | 4/2004 |
| JP | 2006-035413 | 2/2006 |
| JP | 2006-075914 | 3/2006 |
| JP | 2006-165323 | 6/2006 |
| JP | 2007-058200 | 3/2007 |

OTHER PUBLICATIONS

U.S. Appl. No. 12/635,872, filed Dec. 11, 2009, Kojima, et al.

\* cited by examiner

*Primary Examiner* — Timothy V Eley
(74) *Attorney, Agent, or Firm* — Oblon, Spivak, McClelland, Maier & Neustadt, L.L.P.

(57) ABSTRACT

An object of the present invention is to provide a polishing method for diminishing concave defects of a glass substrate used in a reflective mask for EUVL and the like. The invention relates to a method of polishing a glass substrate which comprises polishing a major surface of the glass substrate while feeding a polishing slurry between the glass substrate and a pad surface of a polishing pad, wherein the polishing load of the polishing pad is from 1 to 60 g/cm$^2$. The pad surface of the polishing pact is preferably dressing-processed.

14 Claims, 5 Drawing Sheets

METHOD OF POLISHING GLASS SUBSTRATE

TECHNICAL FIELD

The present invention relates to a method of polishing a glass substrate, and particularly to a polishing method suitable for a glass substrate for a mask blank used in a semiconductor device production step.

BACKGROUND ART

In semiconductor device production steps, an exposure tool for transferring a fine circuit pattern onto a wafer to produce an integrated circuit has hitherto been widely used. In recent years, with the trend toward higher degrees of integration and function advancement in semiconductor integrated circuits, refinement of the semiconductor integrated circuits proceeds. In order to precisely form a circuit pattern image on a wafer surface, a glass substrate for a mask blank used as a photo mask for an exposure tool is required to have a high degree of flatness and smoothness.

Further, under such technical circumstances, a lithographic technique using EUV (extreme ultraviolet) light (extreme ultraviolet light) as a next-generation exposure light has attracted attention since it is considered to be applicable over a plurality of generations, which are the 45-nm and succeeding generations. The EUV light means a light having a wavelength in the soft X-ray region or vacuum ultraviolet region, specifically a light having a wavelength of about 0.2 to 100 nm. At present, it has been investigated to use a light having a wavelength of 13.5 nm as a lithographic light. The exposure principle of this EUV lithography (hereinafter abbreviated as "EUVL") is equal to that of conventional lithography in that a mask pattern is transferred by using an optical projection system. However, a refractive optical system cannot be used because there is no material which transmits light in the EUV light energy region, which results in use of a reflective optical system (see patent document 1).

The photo mask used in EUVL is basically constituted of (1) a substrate, (2) a reflective multilayer film formed on the substrate, and (3) an absorber layer formed on the reflective multilayer film. As the substrate, a material having such a low coefficient of thermal expansion that causes no strain even under irradiation with the EUV light is required, and a glass or crystallized glass having a low coefficient of thermal expansion has been investigated. The substrate is produced by highly accurately polishing and washing a raw material such as the glass or crystallized glass.

In general, methods of polishing a substrate for a magnetic recording medium, a substrate for a semiconductor device, or the like to have a highly smooth surface are known. For example, patent document 2 discloses a method of performing polishing, in regard to finish polishing of a memory hard disk or polishing of a substrate for a semiconductor device, by using a polishing liquid composition comprising water, an abrasive material and an acid compound, having an acidic pH and having an abrasive material concentration lower than 10% by weight, as a polishing method for decreasing surface roughness of a material to be polished after polishing and reducing minute protrusions (convex defects). As the above-mentioned abrasive materials, aluminum oxide, silica, cerium oxide, zirconium oxide and the like are disclosed. As acids for making the pH acidic, nitric acid, sulfuric acid, hydrochloric acid, organic acids and the like are disclosed.

Further, patent document 3 discloses a method of polishing a glass substrate mainly comprising $SiO_2$ by using a polishing slurry comprising colloidal silica having an average primary particle diameter of 50 nm or less and water and adjusted to have a pH ranging from 0.5 to 4, to thereby polish the substrate so as to have a surface roughness Rms of 0.15 nm or less. Furthermore, it is disclosed that the number of concave defects having a width of 60 nm or more can be decreased to 3 or less in the area of 142 nm×142 nm by this polishing method, and that 80 $g/cm^2$ is used as the polishing load (Examples).

Patent Document 1: JP-T-2003-505891
Patent Document 2: JP-A-2003-211351
Patent Document 3: JP-A-2006-35413

DISCLOSURE OF THE INVENTION

Problems that the Invention is to Solve

However, according to the polishing method of patent document 2, the generation of the convex defects among defects generated on the glass substrate can be inhibited also by an action of an acidic polishing effect. However, according to the Examples therein, only surface smoothness having a surface roughness (Ra) of from about 0.2 to 0.3 mm is obtained, and there is no mention about concave defects.

However, in the case of the surface smoothness having a surface roughness (Ra) of from 0.2 to 0.3 mm, it is considered that concave defects are generated in a significant degree. For this reason, although usable as a substrate for a magnetic disk, it is hard to use the substrate as a glass substrate for a reflective mask used in EUVL, particularly, as a glass substrate required to have extremely high surface accuracy and smoothness, such as a reflective mask used in an optical system of an exposure tool for producing semiconductor devices of the 45-nm and succeeding generations.

Further, according to the polishing method of patent document 3, the surface roughness Rms of the glass substrate is decreased to 0.15 nm or less, and concave defects which are supposed to be hardly diminished are inhibited, so that the surface properties can be improved. However, a substrate having further less concave defects and higher surface smoothness has been strongly required for a glass substrate for a mask blank used in a highly precise semiconductor device production apparatus.

The invention has been made in view of the above, and an object thereof is to provide a method of polishing a glass substrate which is usable as a glass substrate for a reflective mask used in EUVL and has less concave defects and high surface smoothness.

Means for Solving the Problems

In order to solve the above-mentioned problems, the present inventors have made intensive investigations on polishing of a glass substrate having high surface polishing accuracy which is also applicable to an optical system of an exposure tool for producing semiconductor devices of the 45-nm and succeeding generations, particularly a method of diminishing the generation of concave defects. As a result, it has been found that when the glass substrate is polished with a polishing pad by using a polishing slurry, it is effective to reduce the polishing load of the polishing pad, particularly for diminishing the concave defects. Further, it has been found that by preliminarily subjecting a pad surface of the polishing pad to dressing processing with a dress plate in that instance, the glass substrate can be efficiently polished with good smoothness and flatness. The present invention has been completed based on the findings.

That is, the invention provides the following methods of polishing a glass substrate, and the following mask for exposure prepared from the glass substrate obtained by the polishing method.

(1) A method of polishing a glass substrate, which comprises polishing a major surface of the glass substrate while feeding a polishing slurry between the glass substrate and a nap layer of a polishing pad, wherein the polishing load of the polishing pad is from 1 to 60 g/cm$^2$.

(2) The method of polishing a glass substrate according to the above (1), wherein the polishing pad is a suede-based pad having a pad surface with the difference in height between the maximum peak and the minimum peak on the surface of 50 μm or less.

(3) The method of polishing a glass substrate according to the above (1) or (2), wherein the polishing load of the polishing pad is from 1 to 25 g/cm$^2$.

(4) The method of polishing a glass substrate according to any one of the above (1) to (3), wherein the pad surface of the polishing pad is dressing-processed with a dress plate.

(5) The method of polishing a glass substrate according to the above (4), wherein the dress plate is electrodeposited diamond.

(6) The method of polishing a glass substrate according to any one of the above (1) to (5), wherein the polishing pad has an average open pore diameter of from 5 to 50 μm.

(7) The method of polishing a glass substrate according to any one of the above (1) to (6), wherein the polishing pad has an average open pore diameter of from 5 to 30 μm.

(8) The method of polishing a glass substrate according to any one of the above (1) to (7), wherein the surface to be polished of the glass substrate is preliminarily polished so as to have a surface roughness Rms of 3 nm or less.

(9) The method of polishing a glass substrate according to any one of the above (1) to (8), wherein the polishing slurry comprises an abrasive material which is silica or ceria having an average primary particle diameter of 60 nm or less.

(10) The method of polishing a glass substrate according to any one of the above (1) to (9), wherein the glass substrate is a glass substrate for a mask blank.

(11) A mask for exposure produced using a glass substrate for a mask blank that has been polished by the method of polishing a glass substrate according to any one of the above (1) to (9).

Advantages of the Invention

According to the invention, the polishing load at the time when polishing is performed with a polishing pad by using a polishing slurry is reduced, thereby making it possible to inhibit the generation of concave defects due to fine particles of an abrasive material and obtain a glass substrate having excellent surface smoothness.

Further, in that instance, by preliminarily subjecting a pad surface of the polishing pad to dressing processing, the glass substrate can be efficiently polished even when the polishing load is reduced, and the smoothness and flatness of the polished surface of the glass substrate can be further improved.

DESCRIPTION OF REFERENCE NUMERALS AND SIGNS

Figure 1:
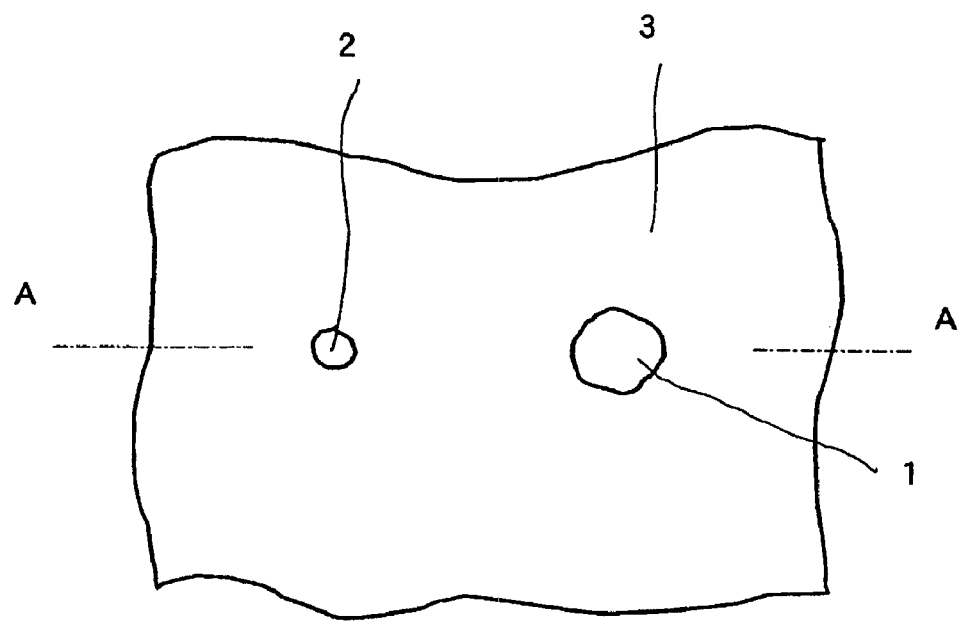
FIG. 1 is an enlarged partial plan view of a polished glass substrate.

1: Concave defect
2: Convex defect
3: Glass substrate
4: Base material
5: Tap layer
6: Polishing pad
7: Polishing platen
8: Polishing carrier
9: Dress plate
10: Unevenness
11: Pad surface
12: Maximum peak
13: Minimum peak

BEST MODE FOR CARRYING OUT THE INVENTION

In general, when a glass substrate is polished with a polishing pad by using a polishing slurry, concave defects and convex defects are generated on the surface of the glass substrate in the course of polishing. First, these defects which are generated on the glass surface will be described.

Figure 2:
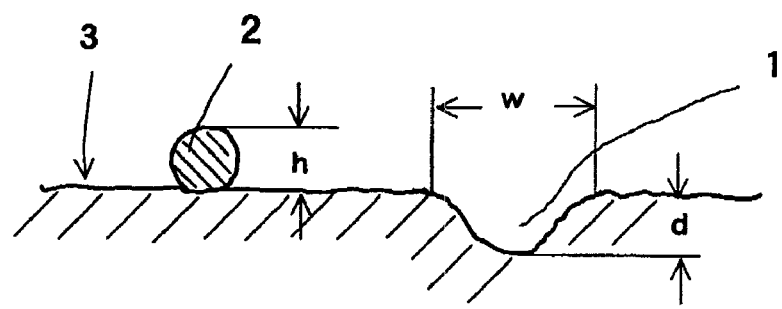
FIG. 2 is a diagrammatic sectional illustration view taken along the A-A part in FIG. 1.

FIG. 1 diagrammatically exemplifies a part of a surface of a glass substrate at the time when observed, for example, with a surface inspection apparatus, M1350 (manufactured by Lasertec Corp.) after the surface of the glass substrate has been finish-polished with a polishing slurry and then washed. FIG. 2 is a diagrammatic sectional view taken along the A-A part in FIG. 1. As shown in FIG. 1 and FIG. 2, there are often present a concave defect 1 and a convex defect 2 which cause a problem at the time of use, in the major surface of the glass substrate 3 polished. In FIG. 2, d indicates the depth of the concave defect 1 and h indicates the height of the convex defect 2.

The concave defects 1 are mainly formed by an abrasive material (for example, fine silica particles) contained in the polishing slurry, in the course of polishing the surface of the glass substrate with the polishing pad. Specifically, it is considered that when the polishing pad cannot sufficiently disperse the polishing load imposed on the fine silica particles in the polishing slurry, the concave defects are formed by the fine silica particles to which the polishing load is concentrated. Accordingly, the generation state of the concave defects 1 varies depending on the particle size or content of the fine silica particles in the polishing slurry, characteristics of the polishing pad to be used, and the like. It can be observed the tendencies that as the size of the fine silica particles becomes larger, the depth and size of the concave defects 1 become greater, and also the generation number thereof becomes larger. This concave defect 1 is a permanent defect which cannot be removed by washing. When the depth and size thereof become larger than certain values, there is a possibility, particularly in the case of an exposure light having a short wavelength, that a phase angle change due to the concave becomes great to cause a phase defect at the time when the glass substrate is used for a mask for exposure.

On the other hand, the convex defect 2 is a protrusion formed by strong adhesion of the fine silica particles, impurities (foreign matter) or the like in the polishing slurry to the major surface of the glass substrate, as shown in FIG. 2. Unlike the above-mentioned concave defect 1, this convex defect 2 can be removed in some degree by changing a method of washing or by washing the major surface by using washing water from which foreign matter has been sufficiently removed. Furthermore, it is also possible to inhibit the generation per se of the convex defect 2 by acidifying the polishing slurry containing the silica particles as described below. However, since the adhesion of the fine silica particles which have once adhered to the glass surface is strong, part of them remain as defects in the case where complete removal cannot be attained by washing.

In the glass substrate polished by the method of the invention, the depth d of the concave defect 1 and the height h of the convex defect 2 are each preferably 2 nm or less, and more preferably 1 nm or less. The glass substrate is preferred to have smaller d and h. However, as long as d and h are 2 nm or less, the generation of the phase defect can be substantially prevented even when a mask for exposure is produced form the glass substrate, and exposure is performed using this mask for exposure, for example, with EUV light having a wavelength of about 0.2 to 100 nm. Incidentally, the depth d of the concave defect 1 and the height h of the convex defect 2 can be measured under an atomic force microscope (hereinafter referred to as AFM), for example, SPA 400, manufactured by Seiko Instrument Inc.

Further, in the glass substrate polished by the method of the invention, the above-mentioned concave defect 1 and convex defect 2, even if present, preferably have a plane-direction size of 60 nm or less in terms of half-value width. The half-value width is more preferably 30 nm or less. The sizes of the concave defect 1 and the convex defect 2 as referred to in the invention means the plane-direction size unless otherwise indicated. The reason why the sizes of the concave defect 1 and the convex defect 2 are specified by the half-value width in the invention is that the concave defect 1 and the convex defect 2 of the glass substrate in the invention are each specified by means of the depth and the height, and the half-value width is excellent in capable of specifying the sizes of these defects in relation to the depth or the height.

Figure 3:
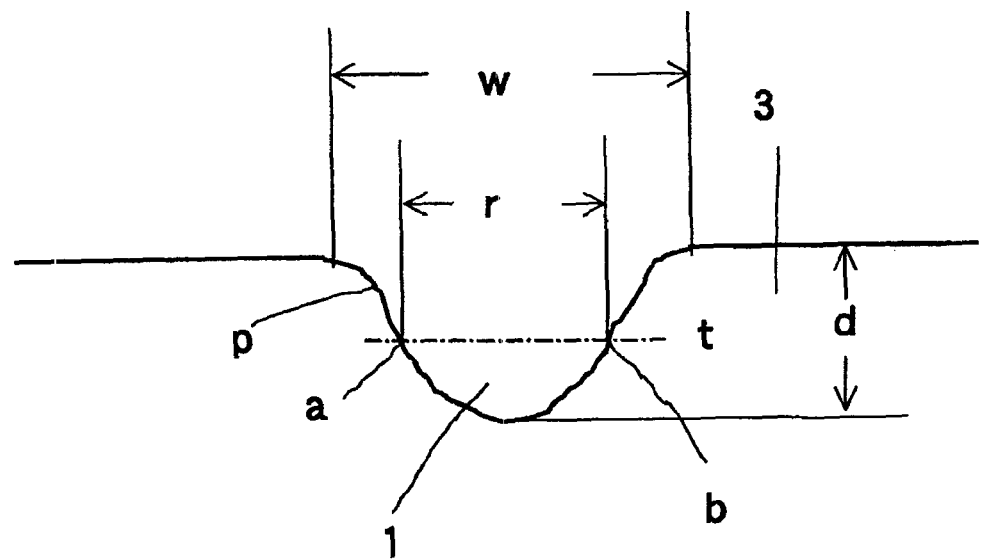
FIG. 3 is a diagrammatic sectional illustration view of the concave defect shown in FIG. 2.

Next, for the concave defect 1, this half-value width will be described in detail with reference to FIG. 3. FIG. 3 is a diagrammatic enlarged sectional view of the concave defect 1 shown in FIG. 2. In general, the concave defect 1 formed in the major surface of the glass substrate 3 is formed as an approximately semispherical concave portion, so that its planar shape is nearly circular. Then, a parabolic shape p is determined from: the diameter w of the approximate circle obtained from the plane shape of the concave defect 1; and the depth d of the concave defect 1. When the intersections of this parabolic shape p and a straight line t extending along a depth of d/2 are taken as a and b, the half-value width r of the concave defect 1 can be obtained as the distance between a and b. Thus, the manner of specifying the size of the concave defect 1 by the half-value width r based on the above-mentioned method can reflect the size and the shape in the depth direction of the concave defect 1. In the case where this half-value width r is more than 60 nm, the influence of the concave defect 1 becomes great when used as a mask for exposure, resulting in a possibility of appearance of a phase defect. Incidentally, although not shown in the figures, the size of the convex defect 2 can be also similarly specified by the half-value width.

In the glass substrate of the invention, the proportion of the concave defects 1 and the convex defects 2 largely varies, particularly depending on whether the polishing slurry containing the fine silica particles is made acidic or alkaline. Specifically, in the case where the polishing slurry is made acidic by addition of an acid, for example, to a pH of 4 or lower is used for polishing, even when the fine silica particles adhere to the glass substrate, the fine silica particles which have adhered are removed by chemical mechanical polishing of the polishing slurry. In addition, adhesion of the fine silica particles is weakened by the acid, so that the above-mentioned fine silica particles become easily removable in the respective steps of polishing and washing. For this reason, polishing with the slurry to which an acid has been added can extremely diminish the convex defects 2 relative to the concave defects 1.

According to the invention, the major surface of the glass substrate is polished to a mirror surface having high surface smoothness, i.e., a small surface roughness Rms, by inhibiting the generation of the above-mentioned concave defects. Accordingly, the invention is suitable for polishing of a glass substrate for a reflective mask used in EUVL, particularly, a glass substrate for a mask blank which requires extremely high surface smoothness, such as a reflective mask used in an optical system of an exposure tool for producing semiconductor devices of the 45-nm and succeeding generations. However, the invention can be also applied, for example, to a glass substrate for a magnetic disk, a glass substrate for a magnetic optical disk and the like, which are required to be polished to high surface smoothness, and is not limited to the glass substrate for a mask blank. The major surface of the glass substrate as referred to herein means the surface that functions as a substrate at the time of use, and specifically, it represents front and back surfaces excluding end faces.

The glass for the glass substrate is not limited in the invention. However, it is preferably a glass having a low coefficient of thermal expansion and reduced variations thereof, in order to obtain a glass substrate for a mask blank which can produce a reflective mask for EUVL and the like that can cope with increased integration and higher fineness of integrated circuits. Specifically, a low-expansion glass having a coefficient of thermal expansion at 20° C. or 50 to 80° C. of −30 to 30 ppb/° C. is suitable. Particularly, an extremely-low-expansion glass having a coefficient of thermal expansion at 20° C. or 50 to 80° C. of −10 to 10 ppb/° C. is preferred, and an extremely-low-expansion glass having an coefficient of thermal expansion at 20° C. or 50 to 80° C. of −5 to 5 ppb/° C. is more preferred. When the above-mentioned reflective mask or the like is formed of such a glass having a low coefficient of thermal expansion and the surface thereof is highly smoothly polished, it sufficiently copes with temperature changes in semiconductor device production steps and can satisfactorily transfer a circuit pattern with high fineness.

As the above-mentioned low-expansion glass and extremely-low-expansion glass, a glass mainly comprising $SiO_2$, typically a silica glass can be used. Specific examples thereof include a synthetic silica glass mainly composed of $SiO_2$ and containing $TiO_2$, and a low-expansion glass or low-expansion crystallized glass such as ULE (registered trademark: Corning Code 7972) and ZERODUR (registered trademark of Schott AG, Germany). Although the glass substrate is usually polished in the form of a rectangular plate-shaped body, the shape thereof is not limited thereto.

The above-mentioned glass substrate is polished with a polishing pad while feeding a polishing slurry. As the above-mentioned polishing slurry in the invention, a polishing slurry comprising an abrasive material and water can be used. As the above-mentioned abrasive material, silica or cerium oxide (ceria) is suitable. As the silica, colloidal silica or fumed silica can be used, and colloidal silica is preferred in that high-purity fine particles having a uniform particle diameter can be easily obtained. The abrasive material will be explained below referring to colloidal silica as an example. Substantially the same explanation applies to other abrasive materials.

In the polishing slurry, the average primary particle diameter of colloidal silica is preferably 60 nm or less, more preferably 30 nm or less, and most preferably 15 nm or less. Further, although the lower limit of the average primary particle diameter of colloidal silica is not limited, it is preferably 5 nm or more from the viewpoint of improving polishing efficiency. When the average primary particle diameter of colloidal silica exceeds 60 nm, this makes it easier to generate large concave defects in the course of polishing, and further, it becomes difficult to polish the glass substrate to a desired surface roughness. Accordingly, it becomes difficult to obtain a glass substrate which conforms to an optical system part and the like of an exposure tool for producing semiconductor devices of the 45-nm and succeeding generations. When the particle diameter of colloidal silica is made small, the polishing efficiency decreases. However, the smaller particle diameter is more effective for inhibition of the concave defects and is more capable of decreasing the surface roughness Rms.

Further, from the viewpoint of strictly controlling the particle diameter, it is desirable that colloidal silica contains secondary particles formed by aggregation of primary particles as less as possible. Even when it contains the secondary particles, the average particle diameter thereof is preferably 70 nm or less. Incidentally, the particle diameter of colloidal silica in the invention is a particle diameter obtained by measuring images at magnifications of $15\text{-}105 \times 10^3$ times under an SEM (scanning electron microscope).

In the above-mentioned polishing slurry, the content of colloidal silica is preferably from 10 to 30% by mass, and more preferably from 18 to 22% by mass. When the content of colloidal silica is less than 10% by mass, the polishing efficiency decreases to cause a prolonged polishing time. This is therefore unfavorable. In particular, in the invention, it is preferred to use colloidal silica of particles having a small average primary particle diameter as described above, and polishing is performed at a low polishing load compared to a conventional one. Accordingly, when the content of colloidal silica is less than 10% by mass, the polishing efficiency may possibly deteriorate, resulting in a failure to attain economical polishing. On the other hand, when the content of colloidal silica exceeds 30% by mass, not only colloidal silica becomes liable to be unevenly distributed during polishing, but also the amount of colloidal silica used increases, although the polishing efficiency is improved. Accordingly, this is unfavorable because it is disadvantageous in economical aspect and because a washing burden after polishing increases.

In the invention, it is preferred that the polishing slurry is adjusted to a pH of 0.5 to 10. In the polishing of the glass substrate, the proportion of the concave defects and the convex defects which are generated on the glass surface largely varies depending on whether the polishing slurry is made acidic or alkaline, particularly in the case of the polishing slurry containing the fine silica particles. Specifically, in the case where the polishing slurry is made acidic by addition of an acid, for example, to a pH of 4 or lower is used for polishing, even when the fine silica particles adhere to the glass substrate, the fine silica particles which have adhered are removed by chemical mechanical polishing of the polishing slurry. In addition, adhesion of the fine silica particles is weakened by the acid, so that the above-mentioned fine silica particles become easily removable in the respective steps of polishing and washing. That is, when the glass substrate is subjected to acidic polishing, convex portions of the glass surface are softened by the acid of the polishing slurry. Accordingly, the convex portions can be easily removed by mechanical polishing. This improves the polishing efficiency and can also prevent the generation of new flaws due to glass powder or waste grass removed by the polishing, because the glass powder or the like is softened. At the same time, the convex defects formed by adhesion of the fine silica particles can be inhibited. Accordingly, as a method of efficiently mirror polishing the glass substrate particularly so as to generate no concave defects, the method of adjusting the polishing slurry to have an acidic pH is effective. In particular, in finish polishing of a glass substrate used for a mask for short-wavelength exposure, which has been demanded in an exposure tool for producing semiconductor devices of the 45-nm and succeeding generations, this acidic polishing is excellent in that the convex defects are inhibited to attain fine mirror polishing. Although the polishing slurry may be alkaline or neutral, the proportion of the concave defects increases in this case.

In the above-mentioned pH regulation of the polishing slurry, when the pH is lower than 0.5, the acidity becomes too strong. Accordingly, this poses a problem with regard to corrosion of a polishing machine. When the pH is lower than 1, handleability of the polishing slurry deteriorates, although it is a level at which the corrosion of the polishing machine does not matter. The pH is therefore preferred to be 1 or higher from a practical standpoint. On the other hand, when the pH is higher than 4, the above-mentioned chemical polishing effect to the glass decreases to increase the concave defects. Accordingly, when the acidic polishing is performed, the pH is preferably 4 or lower.

In the invention, the above-mentioned pH adjustment of the polishing slurry can be performed by using acids selected from inorganic acids or organic acids, either alone or in combination. For convenience sake, many of inorganic acids or organic acids known as a pH adjusting agent for the polishing slurry in the acidic polishing can be appropriately selected to use. For example, the inorganic acids include nitric acid, sulfuric acid, hydrochloric acid, perchloric acid, phosphoric acid and the like. In terms of easy handling, nitric acid is preferred. An acid which is highly corrosive to glass, such as hydrofluoric acid, cannot be used because it makes flaws distinct. Further, the organic acids include oxalic acid, citric acid and the like.

The water used for concentration adjustment or slurrying of the abrasive material in the invention is preferably pure water or ultrapure water from which foreign matter has been removed. Specifically, the foreign matter (fine particles) to be removed is regardless of the material or shape thereof, and pure water or ultrapure water in which the number of fine particles having a maximum diameter of 0.1 μm or more, as measured by a light-scattering method using a laser light or the like, is substantially 1/mL or less is preferred. When more than 1/mL of 0.1- to 10-μm foreign matter is contained in the water, the foreign matter acts as a kind of abrasive material during polishing to cause surface defects such as scratches and pits on the polishing surface of the glass surface. It becomes therefore difficult to obtain a high-quality polished surface. Incidentally, the foreign matter in the water can be removed, for example, by filtration or ultrafiltration through a membrane filter. However, the removing method is not limited thereto.

The polishing of the glass substrate in the invention can be performed by feeding to the polishing apparatus the polishing slurry in which the average primary particle diameter and concentration of the abrasive material and the pH have been adjusted. As this polishing apparatus, a known polishing apparatus can be used. For example, the polishing can be carried out by sandwiching the glass substrate under a given load between polishing platens each having a polishing pad attached thereto, or pushing the above-mentioned polishing platen against one side of the glass substrate, and then relatively rotating the polishing platens with respect to the glass substrate while feeding the polishing slurry to the polishing pad.

Figure 4:
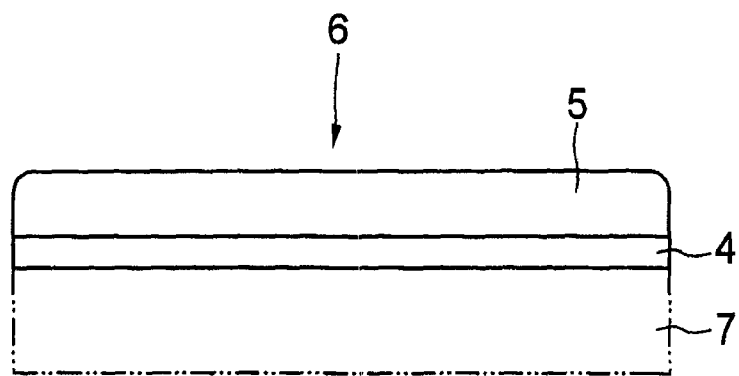
FIG. 4 is a front view of a preferred suede-based pad.

As the above-mentioned polishing pad, a polishing pad in which a nap layer is a suede-based pad is preferred. FIG. 4 shows an example of such a suede-based pad. The polishing pad 6 of this example comprises a base material 4 and a nap layer 5 integrated therewith, and is attached to a polishing platen 7 through the base material 4. The base material 4 is a member made of, for example, a nonwoven fabric, a sheet-form resin or the like, and the polishing pad 6 is attached to the polishing platen 7 through this base material 4, whereby the polishing pad 6 can be easily attached and removed.

However, it is also possible to directly attach the nap layer 5 to the polishing platen 7. In this case, the base material 4 becomes unnecessary.

The nap layer 5 is a polishing member which comes into contact with the major surface of the glass substrate at a predetermined polishing pressure and is rotated (allowed to revolve and to axially rotate) relative to the glass substrate while feeding the polishing slurry between the nap layer and the glass substrate, thereby finish-polishing the major surface of the glass substrate.

The polishing pad 6 having the nap layer 5 is classified as a suede-based pad. The thickness of the nap layer 5 varies depending on the material thereof and the like, and is not limited. However, it is practically preferred that the suede-based pad has a thickness of about 0.3 to 1.0 mm. As the suede-based layer, a flexible resin foam having a moderate compressibility and compressive elastic modulus is preferably used. Specific examples thereof include resin foams such as ether-based, ester-based and carbonate-based resin foams.

The average opening diameter of the polishing pad of the invention is preferably from 5 to 50 μm, more preferably from 5 to 40 μm and still more preferably from 5 to 30 μm. It is particularly preferred to be from 10 to 25 μm. When the polishing is carried out with a polishing pad having an average opening diameter exceeding 50 μm, polishing load distribution occurs, making it difficult to maintain a predetermined polishing quality. On the other hand, when the average opening diameter of the polishing pad is less than 5 μm, there is a concern that it may become impossible to uniformly perform polishing while holding the polishing slurry.

Figure 7:
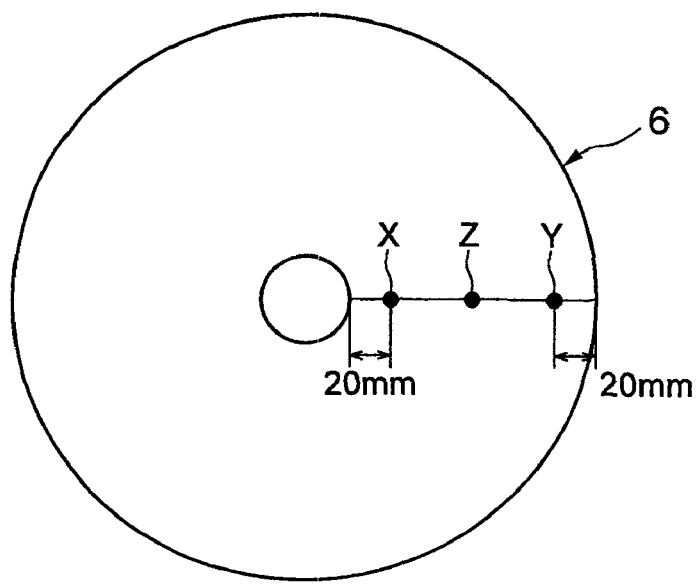
FIG. 7 is a plan view showing measuring points of a polishing pad.

The above-mentioned average opening diameter is calculated by taking images of the pad surface at a magnification of 200 times by using a CCD camera, and subjecting the resulting images to binary coded processing. Specifically, in the case of a doughnut-shaped pad shown in FIG. 7, measurement is made at 3 points x, y and z: x being a point 20 mm apart from a pad inner periphery in any radial direction of the polishing pad, y being a point 20 mm apart from an outer periphery, and z being the intermediate point between these x and y, and the respective opening diameters of the 3 points x, y and z are determined. The average opening diameter in the invention is an average value of the opening diameters at these 3 points. Incidentally, in the case of a non-doughnut-shaped polishing pad, x is taken as a point 20 mm apart from the pad center.

Figure 8:
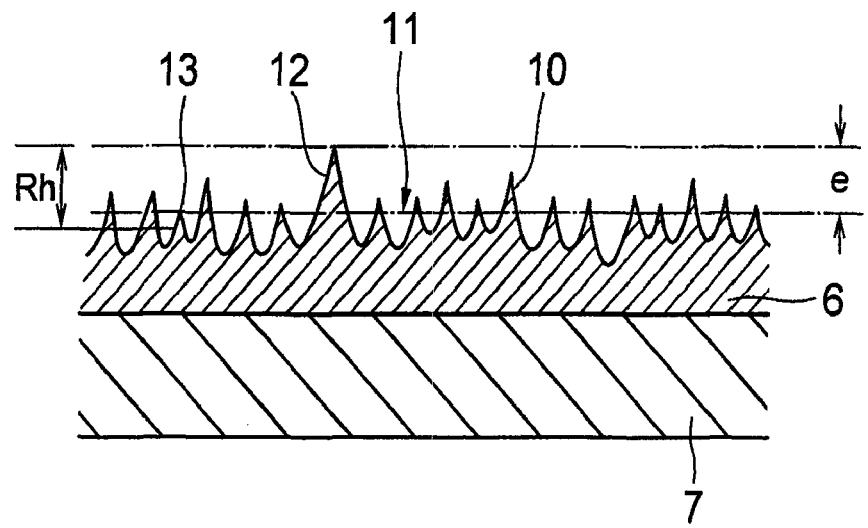
FIG. 8 is a partial enlarged cross-sectional view of a preferred suede-based pad of the invention.

Further, in the polishing pad of the invention, the difference in height (hereinafter referred to as the maximum height difference Rh) between the maximum peak and the minimum peak of the pad surface is preferably 50 μm or less. This maximum height difference Rh is more preferably 30 μm or less, and still more preferably 20 μm or less. This maximum height difference Rh of the pad surface of the polishing pad will be described with reference to a drawing. FIG. 8 is a partial enlarged cross-sectional view diagrammatically showing a suede-based pad. A pad surface 11 of a polishing pad 6 immediately after attached to a polishing platen 7 exhibits flatness at first glance. However, the pad surface is actually formed by fine unevenness 10 as shown in the figure. The above-mentioned maximum height difference Rh is specified as the difference between the maximum peak 12 and the minimum peak 13 of the unevenness 10. In general, in the new polishing pad, the unevenness 10 has sharp tip portions, and further, the degree of non-uniformity in height is large, so that the maximum height difference Rh of the pad surface 11 is from about 60 to 100 μm. With the polishing pad having such a maximum height difference Rh, it is concerned that distribution of the polishing load or the abrasive material readily becomes uneven, and irregularity of the unevenness 10 causes a trouble, thereby failing to attain satisfactory polishing of the glass substrate.

That is, when the glass substrate is polished with the polishing pad 6 having a pad surface with a large maximum height difference Rh, unevenness in distribution of the polishing load or the abrasive material occur. Accordingly, the concave defects are readily generated, and it is difficult to obtain uniform polishing. Further, unevenness 10 having a high degree of protrusion is mainly brought into contact with the glass substrate to perform polishing, so that a contact portion of the polishing pad and the glass substrate decreases, which also causes a problem of lowering the polishing efficiency. In particular, since the polishing load is reduced in this invention, when the glass substrate is polished with a polishing pad having a large maximum height difference Rh, the degree of lowering in polishing efficiency becomes larger.

On the other hand, when the polishing load is increased in order to increase the polishing efficiency, the generation of the concave defects increases, and it becomes difficult to smoothly polish the glass substrate.

Figure 9:
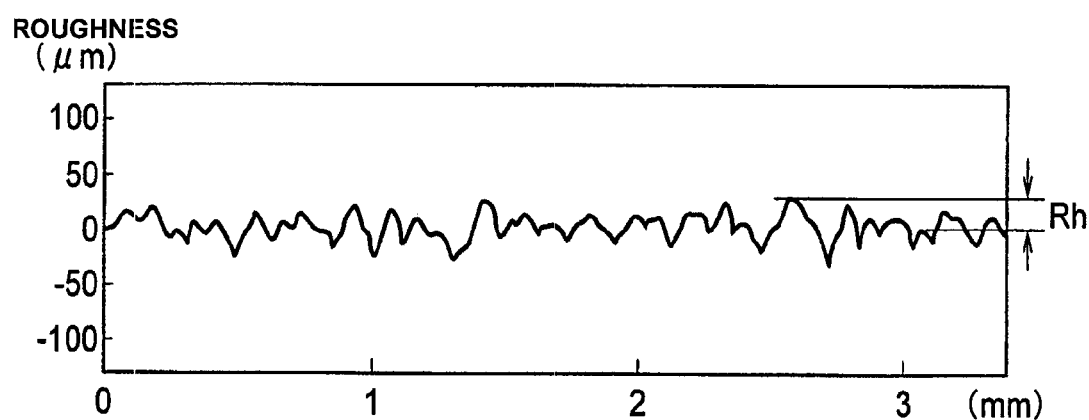
FIG. 9 is a graph showing a surface roughness curve of a dressing-processed surface of a polishing pad.

In a preferred embodiment of the invention, the surface of the polishing pad is dressing-processed on a polishing machine to reduce the above-mentioned maximum height difference Rh to 50 μm or less, thereby improving the pad surface of the polishing pad. FIG. 9 shows a roughness curve of the dressing-processed surface of a polishing pad. As shown in FIG. 9, sharp tip portions of the unevenness have been removed from the dressing-processed pad surface of the polishing pad, and at that time, tips of the unevenness having a high degree of protrusion are strongly dressing polished, resulting in planarization.

This can improve the maximum height difference Rh of the pad surface of the polishing pad to 50 μm or less, and can enlarge the contact portion with the glass substrate. When the maximum height difference Rh is less than 50 μm, a predetermined polishing efficiency can be maintained even in the case where polishing load is reduced, and the glass substrate can be uniformly and highly precisely polished while inhibiting the concave defects. However, when the maximum height difference Rh exceeds 50 μm, the load concentrates at peak portions. Accordingly, even when the polishing load is reduced, there is a concern of the generation of the concave defects. The maximum height difference Rh of the pad surface of the polishing pad is more preferably 30 μm or less, and still more preferably 20 μm or less.

In the invention, the above-mentioned maximum height difference Rh is a value obtained by the following method. Specifically, the polishing surface roughnesses are measured at the same 3 points x, y and z (see FIG. 7) in the radial direction of the polishing pad as the measuring points of the average opening diameter described above, for example, by using a surface roughness measuring device (manufactured by Tokyo Seimitsu Co., Ltd.: Surfcom) to determine respective maximum height differences Rh at the respective measuring points, and the maximum one among them is taken as the maximum height difference of the polishing pad. For measuring conditions here, the measuring length is 4 mm (in the radial direction of the polishing pad), the cutoff wavelength in measurement is 0.8 mm, and the measuring magnification is 200 times. FIG. 9 shows a part of roughness measurement data obtained by measuring the pad surface of the polishing pad under such conditions.

Figure 5:
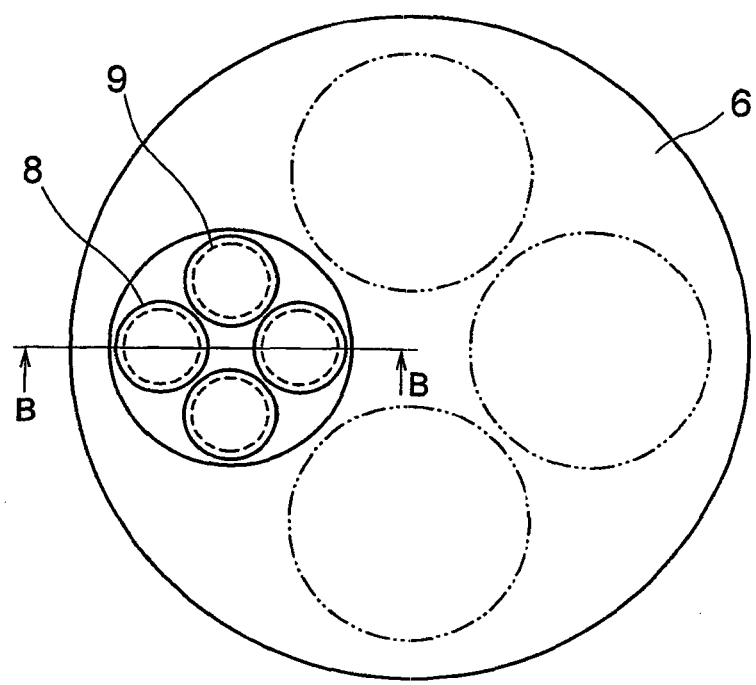
FIG. 5 is a plan illustration view of a preferred dressing processing method of the invention.
Figure 6:
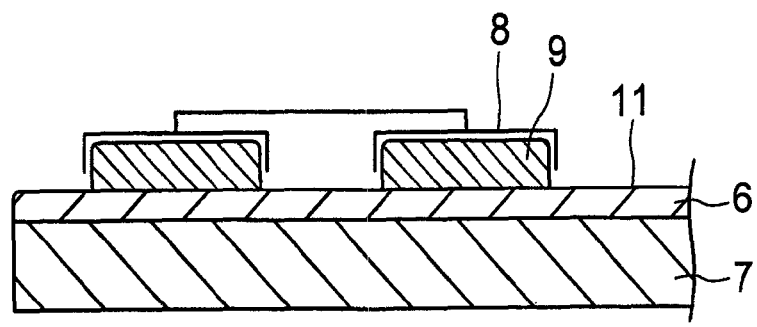
FIG. 6 is an enlarged cross-sectional view taken along the B-B part in FIG. 5.

Next, the dressing processing of the pad surface of the polishing pad will be described. This dressing processing can be performed by polishing the pad surface of the polishing pad with a dress plate prior to the polishing operation. Further, this can be easily performed by attaching this dress plate to the polishing apparatus of the glass substrate. FIG. 5 shows an example of a method of dressing-processing the pad surface of the polishing pad by the polishing apparatus of the glass substrate, and FIG. 6 is a partially enlarged cross-sectional view taken along the B-B part in FIG. 5. As shown in the figures, the polishing apparatus of the glass substrate of the invention is constituted so that the glass substrate to be polished is set to a polishing carrier 8 located on an upper portion of a polishing platen 7 onto which a polishing pad 6 has been attached, and that the polishing platen and the glass substrate are relatively rotated (allowed to revolve and to axially rotate) to each other through the polishing carrier 8 while feeding a polishing slurry between these polishing pad and the glass substrate, thereby polishing the glass substrate. In this example, 4 polishing carriers to each of which 4 glass substrates can be set are arranged at uniform intervals on the polishing platen 7. However, the present invention is not limited thereto, and the design of the polishing carrier can be changed.

It is preferred that the dressing processing of the polishing pad 6 is performed as needed when the polishing pad 6 is newly attached to the polishing platen 7 or when a specific amount of the glass substrate is polished with the polishing pad. For example, in the dressing processing at the time when the polishing pad 6 is newly attached to the polishing platen 7, a dress plate 9 is set in place of the glass substrate in the above-mentioned polishing carrier 8 as shown in FIG. 5, and the polishing apparatus is actuated in the same manner as when the glass substrate is polished while feeding the polishing slurry or pure water between the dress plate 9 and the polishing pad 6 to dressing polish the pad surface of the polishing pad with the dress plate 9.

When this dressing polishing is performed for a predetermined period of time (for example, 1 to 30 minutes), the tip portions of the unevenness that are largely protruded are removed by the polishing action of the dress plate 9 to planarize the pad surface 11 of the polishing pad 6 and concurrently to enlarge the contact portion with the glass substrate. In FIG. 8, e indicates the portion removed when the pad surface 11 of the polishing pad 6 is dressing-processed. As a result, in the dressing-processed pad surface of the polishing pad, the maximum height difference Rh can be improved to 50 μm or less as described above.

Accordingly, when the dress plate 9 is taken out from the polishing carrier 8 after the dressing processing, and the glass substrate is set in the polishing carrier and polished with the dressing-processed polishing pad in the same manner as in conventional methods, the pad surface of the polishing pad improved by the dressing processing holds the abrasive material without unevenness. Accordingly, the glass substrate can be uniformly polished, and also the polishing efficiency can be maintained at a certain level or higher even when the polishing load is reduced. Further, since the polishing load is applied on the glass substrate with no centralization, the generation of the concave defects can be also inhibited.

Further, when the dressing processing of the polishing pad is performed utilizing such a polishing apparatus of the glass substrate, it becomes unnecessary to newly dispose a dressing processing apparatus. Accordingly, the cost of equipment can be reduced.

Furthermore, this is also excellent in workability, because the substance of operations thereof is common to the polishing of the glass substrate. However, the dressing processing may be performed by newly disposing a dressing processing apparatus.

Incidentally, the dress plate taken out from the polishing carrier can be repeatedly used in the next dressing processing. Further, although not shown, the dressing processing of the polishing pad in a both-side polishing apparatus is also basically the same as in both-side polishing of the glass substrate, and can be performed by similarly setting the dress plate in its polishing carrier.

In the invention, as the above-mentioned dress plate, a dress plate in which fine diamond particles are adhered to a substrate having good flatness can be preferably used. Specific examples include electrodeposited diamond, metal-bonded diamond, resin-bonded diamond, vitrified-bonded diamond and the like. Above all, electrodeposited diamond is preferred, because the surface unevenness can be easily suppressed to small, the drop-off of diamond particles scarcely occurs, and it rarely causes that the dropped-off diamond particles remain in the polishing pad to generate scratches on the surface to be polished of the glass substrate. As the material for the substrate, SUS having high chemical resistance is excellent. The flatness thereof is preferably 10 μm or less. Further, in the case where the plurality of dress plates are used at the same time as shown in FIG. 5, if there is a large variation in the plate thicknesses of these dress plates, there is a concern that unevenness occurs in the dressing processing, failing to satisfactorily attain the flatness of the pad surface of the polishing pad. Accordingly, the variation in the plate thicknesses of the dress plates concurrently used in a batch is preferably 10 μm or less.

Although the size of the fine diamond particles adhered to the substrate is not limited, #100 to #1200 mesh particles are preferred, #300 to #1000 mesh particles are more preferred, and #300 to #600 mesh particles are particularly preferred, from the aspects of workability of the dressing processing and obtaining the desired maximum height difference Rh.

Further, the size and shape of the dress plate can be appropriately determined in accordance with the polishing carrier to be set, and are not limited. For example, as for the shape, a circular shape or a square shape is preferred. As for the size, the diameter or side length can be determined within the range of 30 to 700 mm as an indication.

The invention is characterized in that when the glass substrate is polished with the polishing pad, the polishing load of the above-mentioned polishing pad is made to be 1 to 60 g/cm². In the polishing of the glass substrate, the concave defects and the surface roughness can be improved in a certain degree by adjusting the particle size or content of the abrasive material as described above. However, since it is difficult to further improve them under the conventional polishing load and, in particular, the concave defects are liable to be affected by the polishing load, it is considered that the above measures involve a limitation. In the polishing of the glass substrate of this type, the polishing load has hitherto been set in consideration of longstanding results and the polishing efficiency. For example, it is set to 80 g/cm² in the Examples of patent document 3.

Then, in the invention, the polishing load is set to 1 to 60 g/cm², thereby finish-polishing the glass substrate to a surface having less concave defects and excellent surface smoothness. The polishing load is preferably from 5 to 25 g/cm², and more preferably from 10 to 20 g/m². In particular, when used in combination with the dressing processing of the polishing pad, polishing can be innocuously performed with a polishing load as low as 1 to 25 g/cm². When the polishing load is less than 1 g/cm² in the invention, it becomes difficult to control the load of the polishing pad, and the polishing effect is not substantially obtained. On the other hand, when the load is more than 60 g/cm², it becomes difficult to inhibit the generation of the concave defects and to improve the surface roughness. Accordingly, there arises a concern that the object of the invention of diminishing the concave defects and improving the surface roughness may be not achieved.

The polishing method of the invention is particularly suitable as the finish polishing which is finally performed when the glass substrate is polished in a plurality of polishing steps different in the degree of polishing. For this reason, it is preferred that the glass substrate has been preliminarily lapped to a predetermined thickness before polishing, subjected to end-surface polishing and chamfering, and further, preliminarily polished so that the surface roughness of the major surface thereof is reduced to or below a certain value. The preliminary polishing is not limited, and can be performed by a known method. For example, the glass substrate can be preliminarily polished to have a predetermined surface roughness by disposing a plurality of lapping machines successively, and performing polishing in turn with the lapping machines while changing the abrasive material and polishing conditions. The surface roughness Rms of this preliminary polishing is, for example, preferably 3 nm or less, more preferably 1.0 nm or less, and still more preferably 0.5 nm or less.

An object of the invention is to diminish, particularly, concave defects which have been considered to be difficult to diminish, by using the polishing pad and the polishing slurry as described above and polishing the glass substrate under a polishing load of 1 to 60 g/cm². Then, the present invention aims at improving the surface roughness Rms by reflecting such inhibition of the concave defects, inhibition of the convex defects by the acidic polishing effect, and the like. Specifically, the major surface of the polished glass substrate preferably has a surface roughness Rms measured with AFM of 0.15 nm or less, and more preferably 0.10 or less. Here, SPA 400 manufactured by Seiko Instrument Inc. is used as the AFM. When the surface roughness Rms is larger than 0.15 nm, there is a concern that sufficient performance as a glass substrate for an optical system part of an exposure tool for producing semiconductor devices of the 45-nm and succeeding generations, for which increased integration and higher fineness are further strongly required, may be not obtained.

EXAMPLES

An ingot of a synthetic silica glass containing 7% by mass of TiO₂ produced by a flame hydrolysis method was cut into a plate shape having dimensions of 153 mm (width)×153 mm (length)×6.75 mm (thickness) with an inner diameter saw slicer to produce sixty plate samples of the synthetic silica glass (hereinafter referred to as "sample substrates").

Further, these sample substrates were beveled with a commercial diamond wheel so as to result in external dimensions of 152 mm (width) by 152 mm (length) and a beveling width of 0.2 to 0.4 mm.

Next, using a both-side lapping machine (manufactured by Speedfam Co., Ltd.), major surfaces of the sample substrates were polished until the thickness of each sample substrate reached 6.51 mm. Thereafter, these sample substrates were preliminarily polished using a both-side polishing machine (manufactured by Speedfam Co., Ltd.) to a surface roughness Rms of about 0.8 nm. The periphery of each sample substrate was also polished so that the end faces were mirror polished to a surface roughness Ra of 0.05 μm.

Then, the 60 sample substrates preliminarily polished were divided into 4 groups of Examples 1 to 3 and Comparative Example 1, 15 sample substrates being in each group. The same polishing slurry was used to each sample substrate, and used after being adjusted to have a pH of 2 by adding nitric acid to a polishing slurry in which 20% by mass of colloidal silica having an average primary particle diameter of 10 to 20 nm was contained in pure water. Further, as a polishing pad, the same suede-based pad having a maximum height difference Rh of its pad surface of 80 μm was used. However, in Example 1 and Example 3, a polishing pad which had been dressing-processed with electrodeposited diamond prior to finish polishing of the sample substrates was used. Each polishing pad after dressing processing in Example 1 and Example 3 had a maximum height difference Rh of its pad surface of 45 μm and an average opening diameter of 25 μm. Polishing conditions of the finish polishing were all the same except for the polishing load, and are as follows. Further, the polishing load in each group is as shown in Table 1.

(Polishing Conditions)

Polishing machine: Both-side polishing machine
Polishing pad: Suede-based pad, Dressing-processed pad in Example 1 and Example 3
Rotation speed of polishing platen: 35 rpm.
Polishing time: 50 minutes
Dilution water: pure water (specific resistance value: 4.2 MΩ·cm, foreign matter of 0.2 μm or more was filtered off)
Slurry flow rate: 10 L/min The sample substrates was finish-polished under the above-mentioned conditions, and then, washed with a multi-stage automatic washing machine comprising a first tank which was a washing tank using a surfactant solution and succeeding tanks comprising a rinsing tank using ultrapure water and a drying tank using IPA. The sample substrates thus washed were inspected with a surface defect inspection apparatus for photomasks (manufactured by Lasertec Corp.) to detect the number of concave defects having a half-value width of 60 to 150 nm within an area of 142 mm×142 mm, for each of Examples 1 to 3 and Comparative Example 1. The inspection was performed for all of the 15 sample substrates for each, and the total detected number thereof was compared, taking the total detected number of Comparative Example 1 as 1. The results thereof are as shown in Table 1. Incidentally, concave defects having a half-value width of 150 nm or more were detected in Comparative Example 1 in an average number of 0.2, but were not detected in any of Examples 1 to 3.

Further, the surface roughness Rms of each sample substrate was measured with an atomic force microscope (manufactured by Seiko Instrument Inc.). This surface roughness measurement was made for an arbitrary one place (with the area of 10 μm×10 μm) for each sample substrate, and the surface roughness was calculated as an average value of 15 sample substrates. The results thereof are shown in Table 1 together.

TABLE 1

|  | Example 1 | Example 2 | Example 3 | Comparative Example 1 |
|---|---|---|---|---|
| Dressing Processing | Performed | Not Performed | Performed | Not performed |
| Polishing Load (g/cm$^2$) | 20 | 20 | 10 | 80 |
| Concave Defect | 0.2 | 0.6 | 0.2 | 1 |
| Surface Roughness Rms (nm) | 0.06 | 0.07 | 0.06 | 0.08 |

It is seen from Table 1 that concave defects in Examples 1 to 3 where the polishing load was 1 to 60 g/cm$^2$ are 30 to 80% decreased in number compared to Comparative Example 1 where the polishing load was 80 g/cm$^2$. Further, it is seen that although the same polishing load was used in Example 1 and Example 2, the number of concave defects in Example 1 where the pad surface of the polishing pad was dressing-processed is decreased to less than half of that in Example 2 where polishing was performed with the polishing pad not dressing-processed.

Further, the surface roughness Rms in Examples 1 to 3 is improved as compared to Comparative Example 1.

While the invention has been described in detail and with reference to specific embodiments thereof, it will be apparent to one skilled in the art that various changes and modifications can be made therein without departing from the spirit and scope thereof.

This application is based on Japanese Patent Application No. 2007-149705 filed Jun. 5, 2007 and Japanese Patent Application No. 2008-71280 filed Mar. 19, 2008, and the contents thereof are herein incorporated by reference.

INDUSTRIAL APPLICABILITY

Since a glass substrate can be polished to a high-quality surface particularly reduced in concave defects, the present invention is suitable for polishing a glass substrate for a mask blank used in an exposure tool for producing high-precision, high-integration semiconductor devices.

The invention claimed is:

1. A method of polishing a glass substrate, which comprises polishing a major surface of the glass substrate while feeding a polishing slurry comprising silica having an average primary particle diameter of 60 nm or less between the glass substrate and a pad surface of a polishing pad, wherein during the polishing step the polishing pad has a polishing load of from 1 to 60 g/cm$^2$ and wherein the polishing slurry has a pH of 1 to 4 and a colloidal silica content of 10 to 30% by mass.

2. The method of polishing a glass substrate according to claim 1, wherein the polishing pad is a suede-based pad having a pad surface with a maximum peak and a minimum peak wherein the difference in height between the maximum peak and the minimum peak on the surface of 50 μm or less.

3. The method of polishing a glass substrate according to claim 1, wherein the polishing load of the polishing pad is from 1 to 25 g/cm$^2$.

4. The method of polishing a glass substrate according to claim 1, wherein the pad surface of the polishing pad is dressing-processed with a dress plate.

5. The method of polishing a glass substrate according to claim 4, wherein the dress plate is electrodeposited diamond.

6. The method of polishing a glass substrate according to claim 1, wherein the polishing pad has an average open pore diameter of from 5 to 50 μm.

7. The method of polishing a glass substrate according to claim 1, wherein the polishing pad has as average open pore diameter of from 5 to 30 μm.

8. The method of polishing a glass substrate according to claim 1, wherein the surface to be polished of the glass substrate is preliminarily polished so as to have a surface roughness Rms of 3 nm or less.

9. The method of polishing a glass substrate according to claim 1, wherein the polishing slurry has an average primary particle diameter of 30 nm or less.

10. The method of polishing a glass substrate according to claim 1, wherein the glass substrate is a glass substrate for a mask blank.

11. The method of polishing a glass substrate according to claim 1, wherein the polishing slurry has an average primary particle diameter of 15 nm or less.

12. The method of polishing a glass substrate according to claim 1, wherein the polishing slurry comprises silica.

13. The method of polishing a glass substrate according to claim 1, wherein the polishing slurry comprises-ceria.

14. The method of polishing a glass substrate according to claim 1, wherein the polishing slurry has a colloidal silica content of 18 to 22% by mass.

* * * * *